(12) United States Patent
Murayama

(10) Patent No.: US 8,397,571 B2
(45) Date of Patent: *Mar. 19, 2013

(54) SENSOR OUTPUT CIRCUIT

(75) Inventor: Katashi Murayama, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 417 days.

This patent is subject to a terminal disclaimer.

(21) Appl. No.: 12/781,796

(22) Filed: May 17, 2010

(65) Prior Publication Data

US 2010/0301937 A1  Dec. 2, 2010

(30) Foreign Application Priority Data

Jun. 1, 2009  (JP) ................................ 2009-132495

(51) Int. Cl.
*G01P 3/00* (2006.01)
*G01P 15/00* (2006.01)

(52) U.S. Cl. .......................................... 73/510; 73/495

(58) Field of Classification Search .................... 73/510, 73/497, 1.38, 1.88, 514.16, 495; 702/104
See application file for complete search history.

(56) References Cited

U.S. PATENT DOCUMENTS

| | | | |
|---|---|---|---|
| 4,914,598 A * | 4/1990 | Krogmann et al. ............. 701/11 |
| 5,220,831 A | 6/1993 | Lee | |
| 5,241,850 A | 9/1993 | Kawate | |
| 5,497,668 A * | 3/1996 | Okada ...................... 73/862.626 |
| 5,686,665 A * | 11/1997 | Hara et al. ....................... 73/495 |
| 6,023,664 A * | 2/2000 | Bennet .......................... 702/141 |
| 6,269,696 B1 | 8/2001 | Weinberg et al. | |
| 6,826,502 B2 * | 11/2004 | Savard .......................... 702/104 |
| 7,398,688 B2 * | 7/2008 | Zdeblick et al. ................ 73/700 |
| 7,520,170 B2 * | 4/2009 | Murayama ...................... 73/510 |
| 2003/0144808 A1 | 7/2003 | Savard | |
| 2005/0274180 A1 | 12/2005 | Zhao et al. | |

FOREIGN PATENT DOCUMENTS

JP        10-239196        11/1998

* cited by examiner

*Primary Examiner* — Helen C. Kwok

(74) *Attorney, Agent, or Firm* — Charles Bergere

(57) ABSTRACT

An output circuit that occupies a small area includes a control unit, X, Y, and Z axes amplification units, and first and second common circuits. The control unit outputs a temperature coefficient offset for correcting the temperature dependence of a sensor output. The first and second common circuits use the output from an acceleration sensor when performed amplification for each axis. In a reset phase, the charge accumulated in the first and second common circuits is released. In an amplification phase, the first and second common circuits and an operational amplifier uses the temperature coefficient offset voltage of each voltage to correct and amplify a signal from the acceleration sensor. In a hold phase, the accumulated charge is maintained in the same state to hold the output value of each axis.

5 Claims, 8 Drawing Sheets

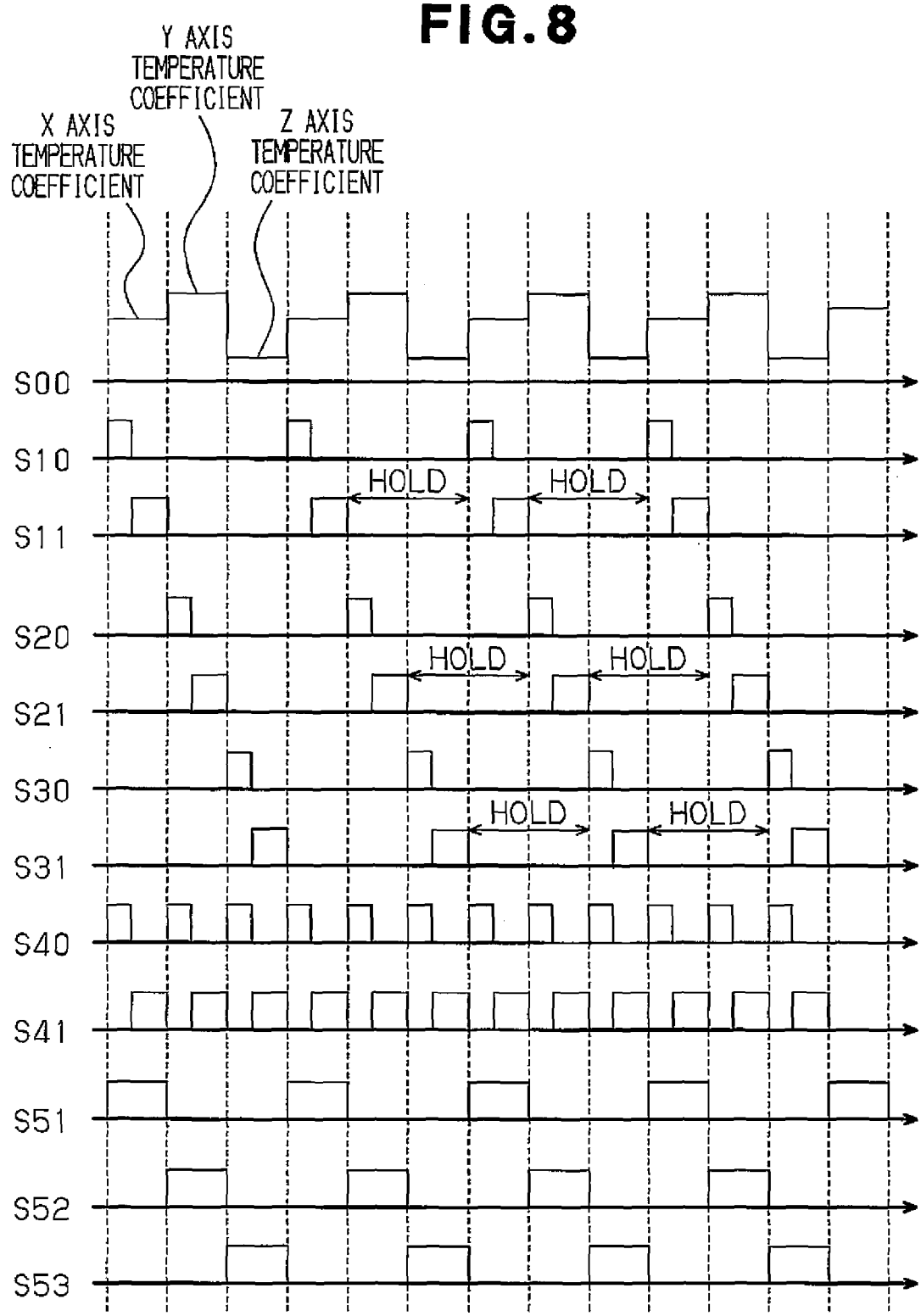

US 8,397,571 B2

SENSOR OUTPUT CIRCUIT

BACKGROUND OF THE INVENTION

The present invention relates to sensor circuits, and, more particularly, to an output circuit that outputs a sensor detection signal.

Micromachining technology is used to manufacture sensors for detecting pressure, acceleration, and the like. Micromachining allows for such sensors to be made very small, mass produced, and have a high accuracy. Such a sensor may handle a plurality of parameters (e.g., values for a plurality of coordinate axes). Japanese Laid-Open Patent Publication No. 10-239196 (FIG. 3) describes a low cost interface circuit that has a simple structure. The interface circuit is connected to a capacitive type sensor including two capacitors having variable values. The interface circuit includes an operational amplifier. A sampling capacitor is connected between the output terminal and inverting input terminal of the operational amplifier. A hold capacitor is connected between the non-inverting input terminal of the operational amplifier and a reference voltage source. The inverting input terminal of the amplifier is connected to one end of first, second, and third capacitors. The other end of each of the first and second capacitors is connected to a power supply and the third capacitor is short-circuited. The other ends of the first and second capacitors and the output terminal of the amplifier are each connected to the non-inverting input terminal of the amplifier. Multiple sensors are connected sequentially to the interface circuit via a switching circuit.

Japanese Laid-Open Patent Publication No. 2009-20094 (FIG. 2) describes an acceleration sensor unit that allows for reduction of the chip size. The sensor unit is connected to an acceleration sensor that detects acceleration in each direction of the X, Y, and Z axes. The sensor unit includes a circuit that sequentially generates a temperature coefficient for correcting the acceleration in each of the X, Y, and Z axes directions. The accelerations are corrected sequentially with the corresponding one of the temperature coefficients to generate an acceleration signal.

In the technology described in Japanese Laid-Open Patent Publication No. 10-239196, the same operational amplifier is shared to reduce the chip size. In the technology described in Japanese Laid-Open Patent Publication No. 2009-20094, the same circuit for generating the temperature coefficient is shared to reduce the chip size. However, the output circuit is formed by capacitors that include an analog switch or capacitance. Thus, further reduction in area is required.

BRIEF DESCRIPTION OF THE DRAWINGS

The invention, together with objects and advantages thereof, may best be understood by reference to the following description of the presently preferred embodiments together with the accompanying drawings in which:

FIG. 8 is a timing chart showing the operation of the output circuit.

DETAILED DESCRIPTION OF THE INVENTION

Figure 1:
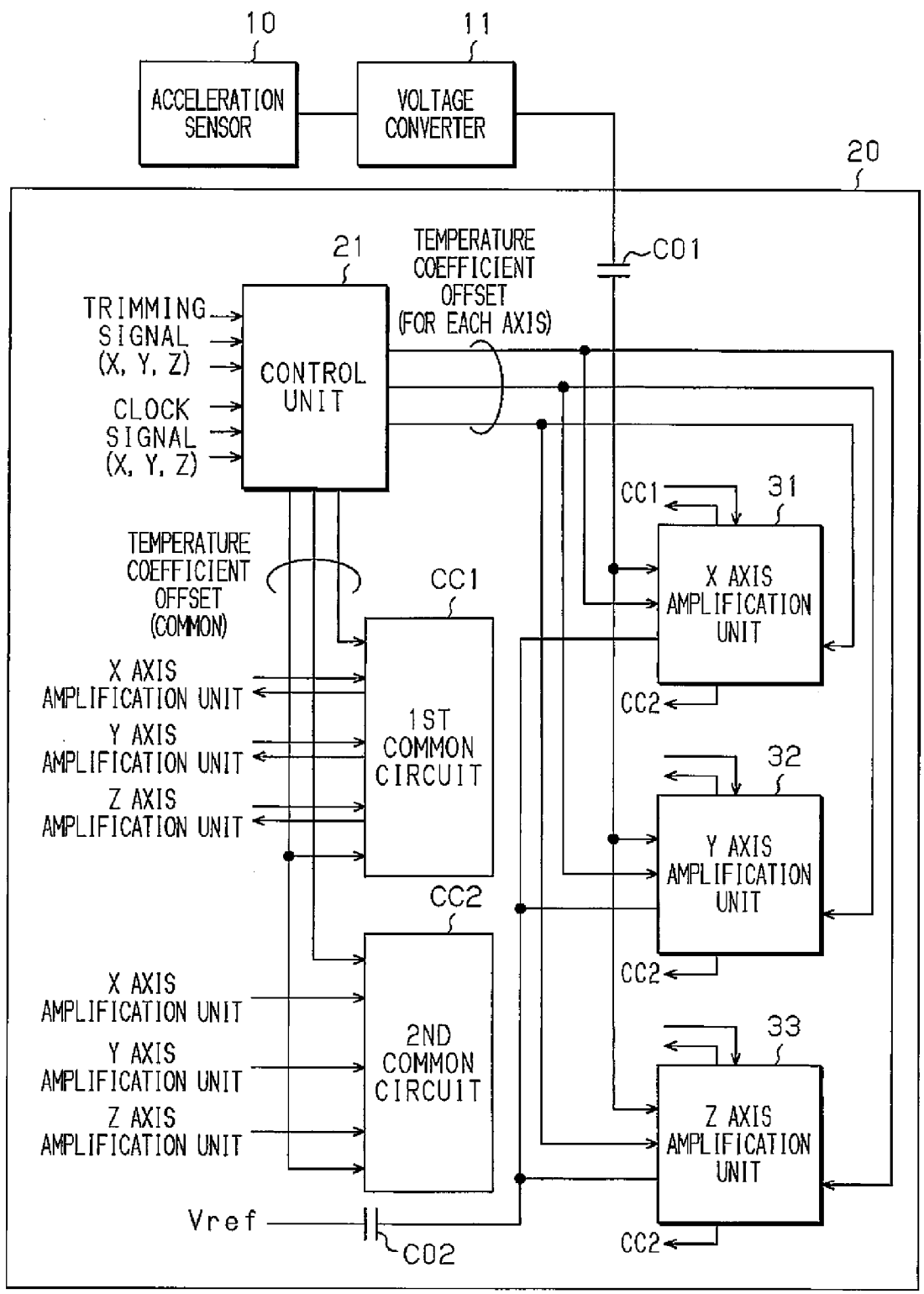
FIG. 1 is a diagram showing the entire structure of a sensor unit according to one embodiment of the present invention.

The present invention provides an output circuit that occupies a small area.

One aspect of the present invention is an output circuit including a first capacitor sequentially provided with sensor measurement signals from a plurality of sensors. A differential amplification circuit is arranged for each sensor and includes a first terminal, which receives voltage of the first capacitor, and a second terminal, which receives a reference voltage for correcting the sensor measurement signals. A hold capacitor is arranged in each differential amplification circuit between an output terminal and the first terminal. A correction coefficient generation circuit sequentially provides correction coefficients for correcting the sensor measurement signals of the sensors. A second capacitor accumulates the correction coefficients from the correction coefficient generation circuit and provides the correction coefficients to the second terminal of the differential amplification circuit. A first switch circuit connects the second capacitor to each differential amplification circuit in synchronism with the sensor measurement signals.

Other aspects and advantages of the present invention will become apparent from the following description, taken in conjunction with the accompanying drawings, illustrating by way of example the principles of the invention.

An output circuit 20 according to one embodiment of the present invention will now be discussed with reference to FIGS. 1 to 8. The output circuit 20 is applied to a sensor unit, which performs temperature calibration on the output of an acceleration sensor and outputs the temperature-calibrated value. The output circuit 20 is connected to an acceleration sensor 10 and a voltage converter 11.

The acceleration sensor 10 detects acceleration for three axes, namely, the X axis, Y axis, and Z axis, as a capacitance. Further, the acceleration sensor 10 sequentially outputs the acceleration (capacitance) detected for each axis as serial data. The voltage converter 11 converts the capacitance obtained from the acceleration sensor 10 to a voltage and supplies the voltage to the output circuit 20. In the present embodiment, the voltage converter 11 uses a reference voltage Vref as a reference so that voltage conversion is performed in accordance with the capacitance.

The output circuit 20 includes capacitors C01 and C02, a control unit 21, an X axis amplification unit 31, a Y axis amplification unit 32, a Z axis amplification unit 33, a first common circuit CC1, and a second common circuit CC2. The capacitor C01 is connected to the voltage converter 11.

The control unit 21 outputs a temperature coefficient offset voltage that is used to correct the temperature dependency of the sensor output. More specifically, the control unit 21 is provided with a trimming signal for setting a temperature coefficient offset value (correction coefficient). The control unit 21 includes a decoder, which receives a trimming signal, and a register, which holds the temperature coefficient offset value for each axis. The control unit 21 decodes the X axis trimming signal with the decoder and reads the X axis temperature coefficient offset value from the register based on the decoding result. The X axis temperature coefficient offset voltage corresponding to the read X axis temperature coefficient offset value is supplied as a reference voltage to an operational amplifier (differential amplification circuit) of the X axis amplification unit 31. In the same manner, the control unit 21 decodes the Y axis and Z axis trimming signals and provides the Y axis and Z axis temperature coefficient offsets to operational amplifiers of the Y and Z axis amplification units 32 and 33, respectively. Thus, the control unit 21 functions as a correction coefficient generation circuit.

The control unit 21 also controls switches (MOS transistors) of each circuit to provide the X, Y, and Z amplification units 31, 32, and 33 with a sensor output or temperature coefficient offset voltage.

A feed line for the reference voltage Vref is connected to the X, Y, and Z amplification units 31, 32, and 33 via the capacitor C02. In a preferred embodiment, the capacitors C01 and C02 have the same capacitance values. The capacitor C02 equalizes the input load applied to the non-inverting input terminal with the input load applied to the inverting input terminal in an operational amplifier. This cancels same phase switching noise. The reference voltage Vref is set by a value that is one half of the power supply voltage. Comparison with the reference voltage Vref is performed at a normal temperature (27° C.). If the temperature differs from the normal temperature, the offset voltage is increased or decreased in correspondence with the temperature coefficient.

Due to the sensor layout or shape, the temperature coefficient offset voltage differs between the X, Y, and Z axes. In the present embodiment, four types of signals are used as temperature coefficient offsets. More specifically, signals for the temperature coefficient offset voltage of each axis (X axis offset signals, Y axis offset signals, and Z axis offset signals) and common offset signals, which provide the temperature coefficient offset voltage of each axis in chronological order, are used. The control unit 21 obtains a trimming signal and a clock signal for each axis and provides an offset signal for each axis to the corresponding X, Y, and Z axis amplification units 31, 32, and 33. The control unit 21 also generates and provides the first and second common circuits CC1 and CC2 with the common offset signals, which are in chronological order.

The first and second common circuits CC1 and CC2 are used to amplify the output from the acceleration sensor 10 for each axis. The first and second common circuits CC1 and CC2 are connected to the X, Y, and Z axis amplification units 31, 32, and 33 and synchronized with X, Y, and Z axes signals.

Figure 2:
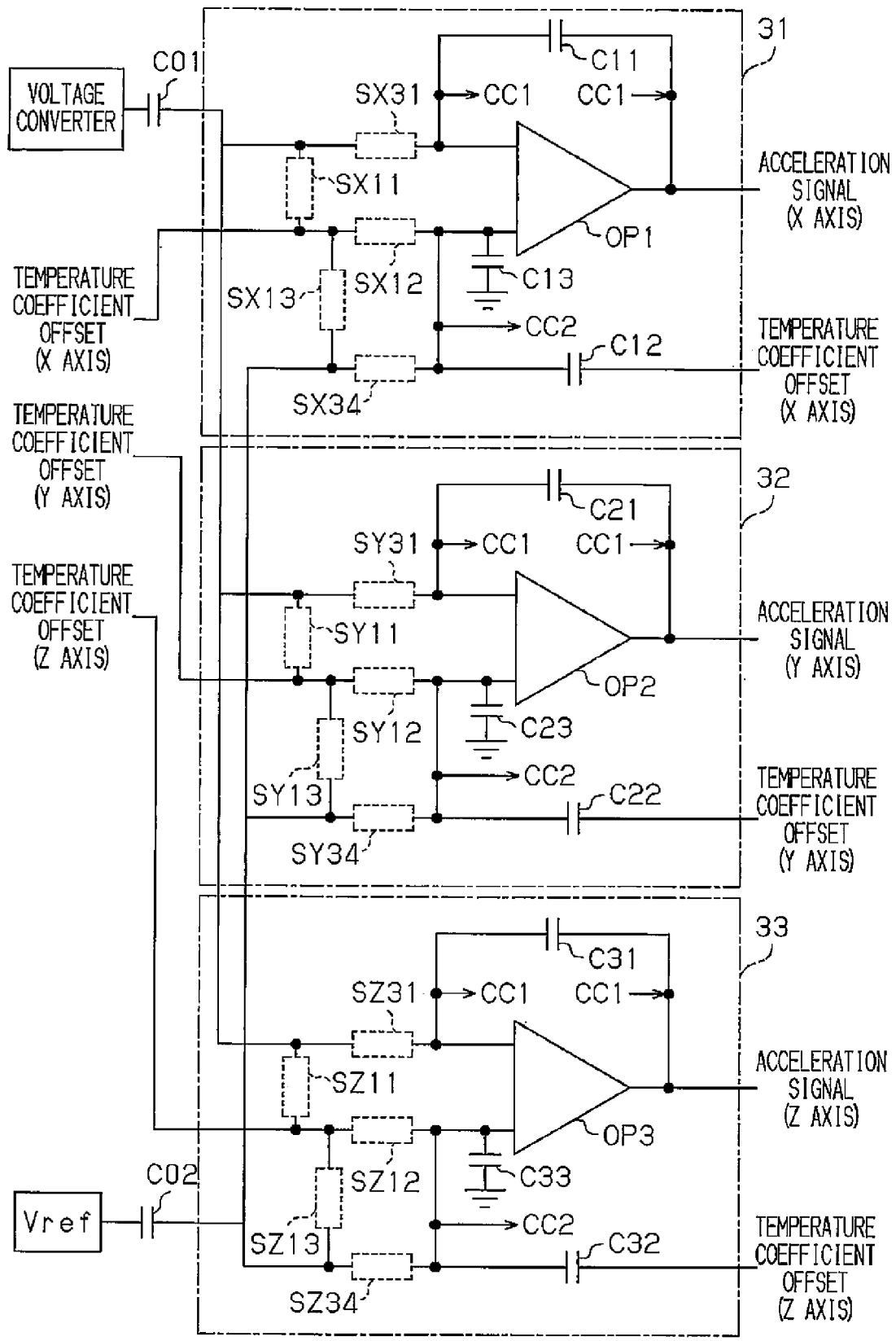
FIG. 2 is a circuit diagram of an output circuit shown in FIG. 1.

The structures of the X, Y, and Z axis amplification units 31, 32, and 33 will now be discussed with reference to FIG. 2. The X axis amplification unit 31 includes an operational amplifier OP1, capacitors C11, C12, and C13, and switches SX11, SX12, SX13, SX31, and SX34. The Y axis amplification unit 32 includes an operational amplifier OP2, capacitors C21, C22, and C23, and switches SY11, SY12, SY13, SY31, and SY34. Similarly, the Z axis amplification unit 33 includes an operational amplifier OP3, capacitors C31, C32, and C33, and switches SZ11, SZ12, SZ13, SZ31, and SZ34.

The capacitors C11, C21, and C31 function as hold capacitors that hold the outputs of the corresponding operational amplifiers OP1, OP2, and OP3.

The X, Y, and Z axis amplification units 31, 32, and 33 are each formed in the same manner. Thus, only the X axis amplification unit 31 will be described here.

The switch SX11 connects the capacitor C01, which is connected to the voltage converter 11, and a feed line of the X axis offset signal, which is output from the control unit 21.

The switch SX31 connects the capacitor C01, which functions as a first capacitor, to the inverting input terminal of the operational amplifier OP1.

The switch SX12 connects the feed line of the X axis offset signal to the non-inverting input terminal of the operational amplifier OP1.

The capacitor C11 is arranged between the inverting input terminal (first terminal) and the output terminal of the operational amplifier OP1. The operational amplifier OP1 obtains the difference between the input signal and the temperature coefficient (reference voltage) and amplifies the difference to generate an acceleration signal.

The capacitor C13, which is grounded, is connected to the non-inverting input terminal (second terminal) of the operational amplifier OP1. The feed line of the X axis offset signal also is connected via the capacitor C12 to the non-inverting input terminal.

The capacitor C02, which is connected to the feed line of the reference voltage Vref, is connected via the switch SX34 to a connection node between the capacitors C12 and C13. The capacitor C02 also is connected via the switches SX13 and SX12 to the non-inverting input terminal of the operational amplifier OP1.

Figure 3:
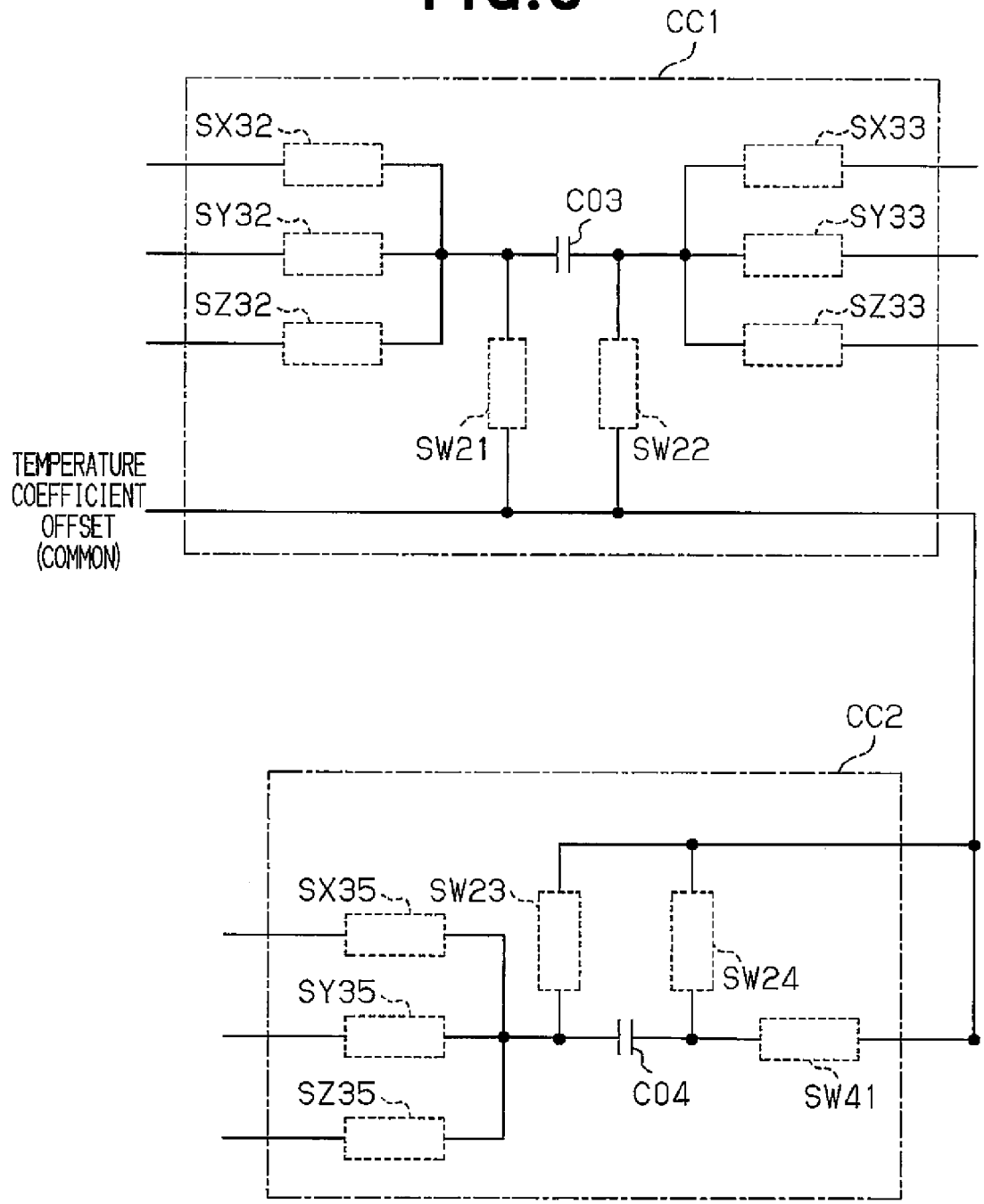
FIG. 3 is a circuit diagram of a common circuit shown in FIG. 1.

The connection of the first and second common circuits CC1 and CC2 will now be described with reference to FIG. 3.

The first common circuit CC1 includes a capacitor C03. The capacitor C03 has one end connected via switches SX32, SY32, and SZ32 to the inverting input terminals of the operational amplifiers OP1, OP2, and OP3, and a second end connected via switches SX33, SY33, and SZ33 to the output terminals of the operational amplifiers OP1, OP2, and OP3. The capacitor C03 also is connected via switches SW21 and SW22 to a feed line for a common offset signal. The switches SX32, SY32, SZ32, SX33, SY33, SZ33, SW21, and SW22 function as a second switch circuit.

The second common circuit CC2 includes a capacitor C04 that has one end connected via switches SX35, SY35, and SZ35 to the non-inverting input terminals of the operational amplifiers OP1, OP2, and OP3, and another end connected via a switch SW41 to the feed line for the common offset signal. The capacitor C04 cancels spikes and noise in the output voltage caused by charge injection by the capacitors and switches at the inverting input terminal side of the operational amplifier. The switches SX35, SY35, SZ35, SW23, SW24, and SW41 function as a first switch circuit.

The operation of the output circuit 20 when correcting and outputting a signal from the acceleration sensor 10 will now be described. In order to share the first and second common circuits CC1 and CC2, three phases (reset, amplification, and hold) are executed sequentially.

In the reset phase, the charge accumulated in the capacitors of the first and second common circuits CC1 and CC2 is released to perform resetting. In the amplification phase, the signal from the acceleration sensor is corrected and amplified with the temperature coefficient offset voltage of each axis. In the hold phase, the charge accumulated in the capacitors is maintained in the same state to hold the output value of each axis.

The switch operation in each phase will now be described using the X axis as a representative example. Here, the switches are categorized into the following four groups:

X axis clock switch group, which includes the switches SX11, SX12, and SX13;

common axis group, which includes the switches SW21, SW22, SW23, and SW24;

inverting X axis clock switch group, which includes the switches SX31, SX32, SX33, SX34, and SX35; and inverting common clock switch group, which includes the switch SW41.

Signal S00, which is shown in FIG. 8, is provided as the offset common signal. In the signal S00, the temperature coefficient offset voltage, which is for correcting the outputs of the X to Z axes, is output in chronological order.

The X axis clock switch group is provided with a signal S10, and the inverting X axis clock switch group is provided with a signal S11. Further, the common clock switch group is provided with a signal S40, and the inverting common clock switch group is provided with a signal S41.

The clock switch groups and inverting clock switch groups for the Y and Z axes are respectively provided with signals S20, S21, S30, and S31.

The signals S10 and S11 are generated in synchronism with a clock signal S51. The signals S20 and S21 are generated in synchronism with a clock signal S52. The signals S30 and S31 are generated in synchronism with a clock signal S53. The signal S40 is generated in synchronism with the clock signals S20, S30, and S40. The signal S41 is generated in synchronism with the clock signals S21, S31, and S41.

Figure 4:
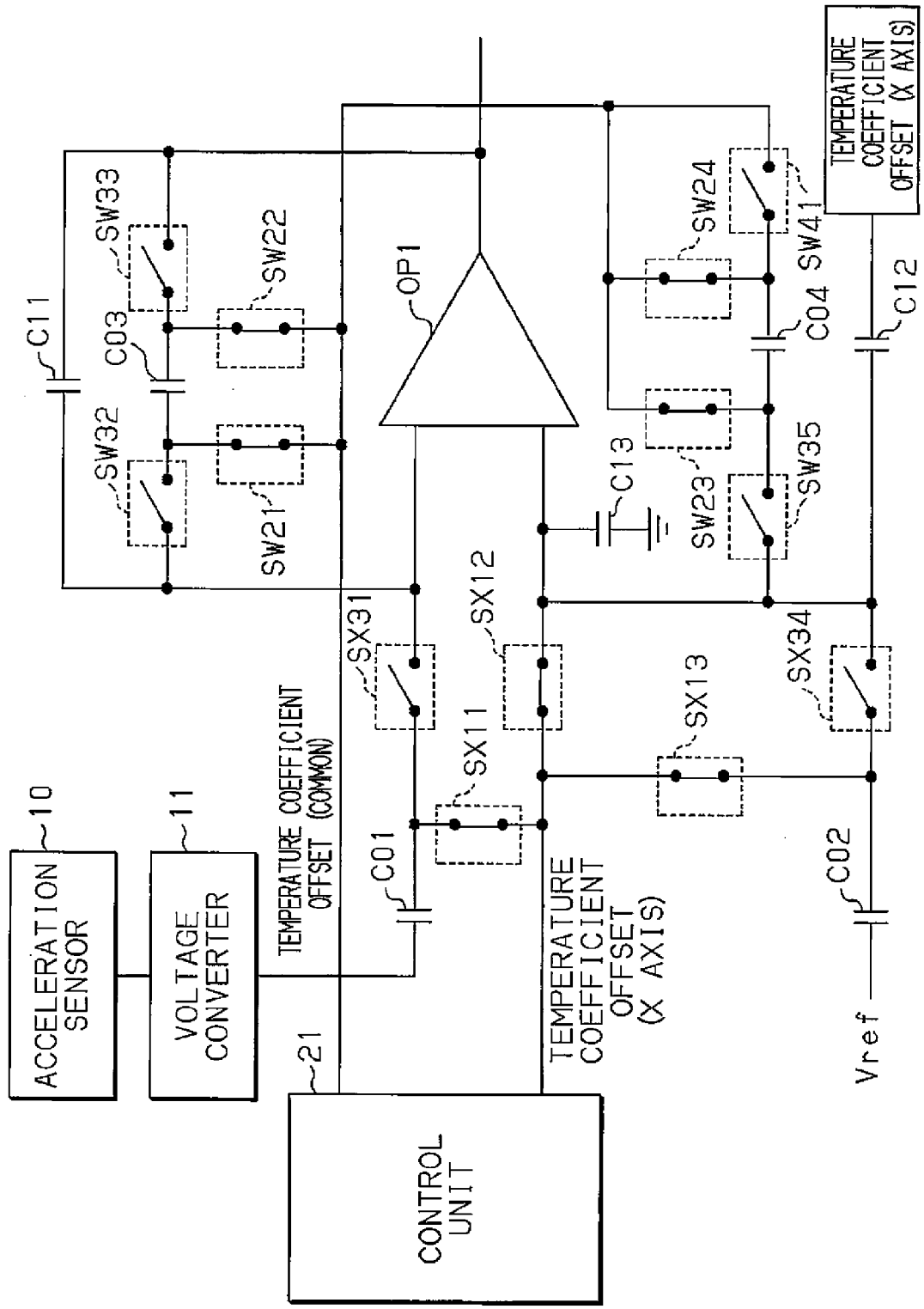
FIG. 4 is a circuit diagram showing the operation of the output circuit in a reset phase.

In the reset phase, the X axis clock switch group and the common clock switch group are closed. Further, the inverting X axis clock switch group and the inverting common clock switch group are open. This forms a connection relationship that is shown in FIG. 4.

In this case, the X axis temperature coefficient offset voltage is supplied via the switch SX11 to the capacitor C01 and supplied via the switch SX12 to the capacitors C13 and C12. As a result, the voltage of the capacitor C13 becomes the X axis temperature coefficient offset voltage, and charge corresponding to the voltage is accumulated. Further, the X axis temperature coefficient offset voltage is applied to the two ends of the capacitor C12. This results in discharging, and the potential difference becomes zero.

The capacitor C01 accumulates charge corresponding to the difference between the X axis temperature coefficient offset voltage and the voltage supplied from the voltage converter 11 (voltage corresponding to the capacitance based on the reference voltage Vref).

The capacitor C02 accumulates charging corresponding to the difference between the reference voltage Vref and the X axis temperature coefficient offset voltage.

Further, the two ends of each of the capacitors C03 and C04 are short circuited via the feed line of the offset common signal by the switches SW21 to SW24 and simultaneously discharged (reset).

The charge of the previous cycle is accumulated in the capacitor C11.

Figure 5:
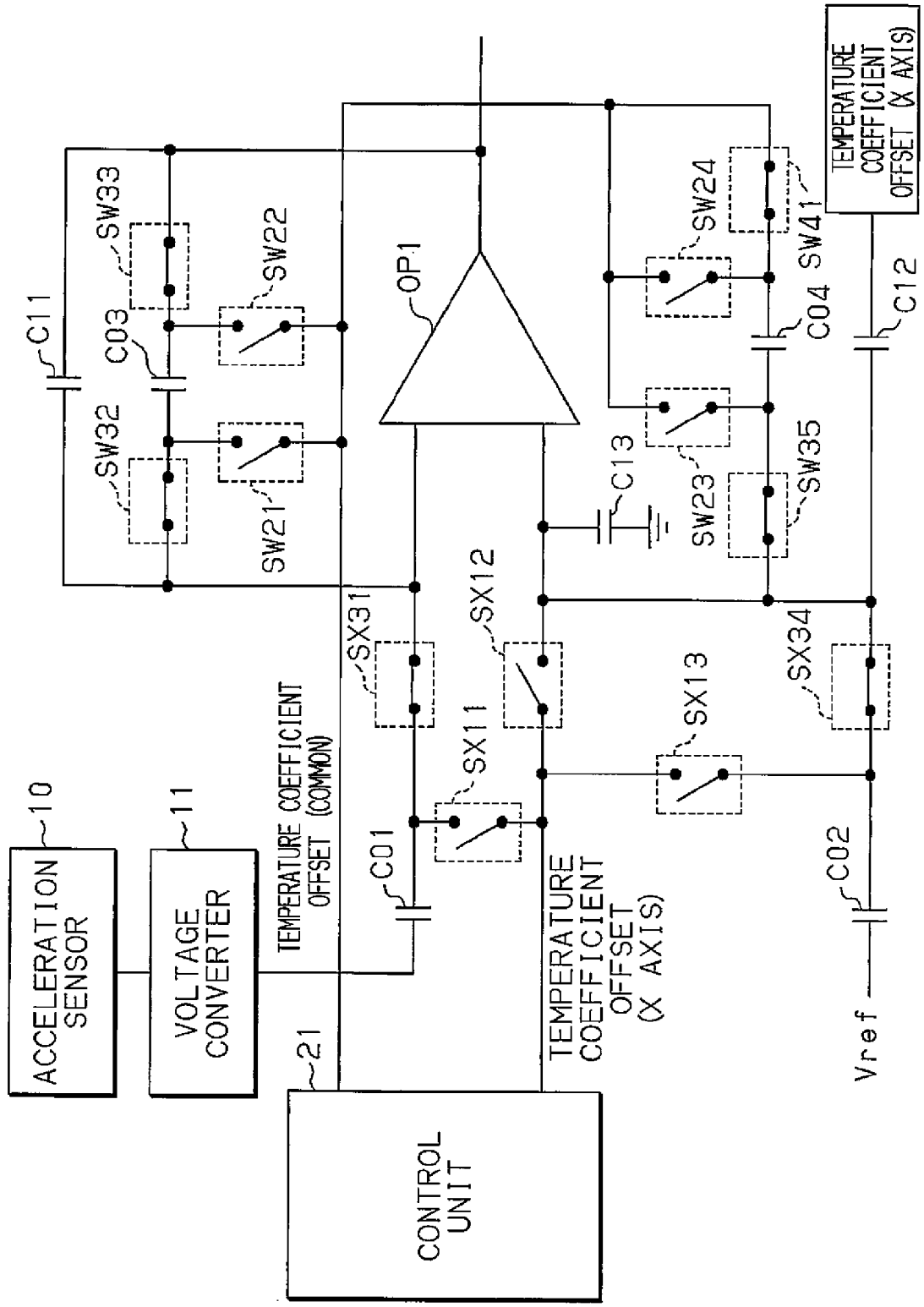
FIG. 5 is a circuit diagram showing the operation of the output circuit in an amplification phase.

In the amplification phase, the X axis clock switch group and the common clock switch group are open, while the inverting X axis clock switch group and the inverting common clock switch group are closed. This forms a connection relationship that is shown in FIG. 5.

In this case, the voltage resulting from the charge supplied from the voltage converter 11 and accumulated in the capacitor C01 is supplied via the switch SX31 to the inverting input terminal of the operational amplifier OP1.

The capacitor C13 maintains the accumulated charge. This maintains the X axis temperature coefficient offset voltage as a potential difference. The capacitor C02 maintains the charge corresponding to the difference between the reference voltage Vref and the X axis temperature coefficient offset voltage accumulated in the capacitor C13. The capacitor C04 stores the charge corresponding to the difference between the X axis temperature coefficient offset voltage and the common offset voltage. However, the common offset voltage is the X axis temperature coefficient offset voltage. Thus, the potential difference is zero.

Further, the X axis temperature coefficient offset voltage is applied to the two ends of the capacitor C12. This maintains the potential difference at zero in a discharged state.

The non-inverting input terminal of the operational amplifier OP1 is supplied with the X axis temperature coefficient offset voltage accumulated in the capacitor C13. In this state, the operational amplifier OP1 amplifies the difference of the voltage supplied from the voltage converter 11 and the voltage of the capacitor C13. Then, the operational amplifier OP1 outputs the amplified difference from the output terminal.

Figure 6:
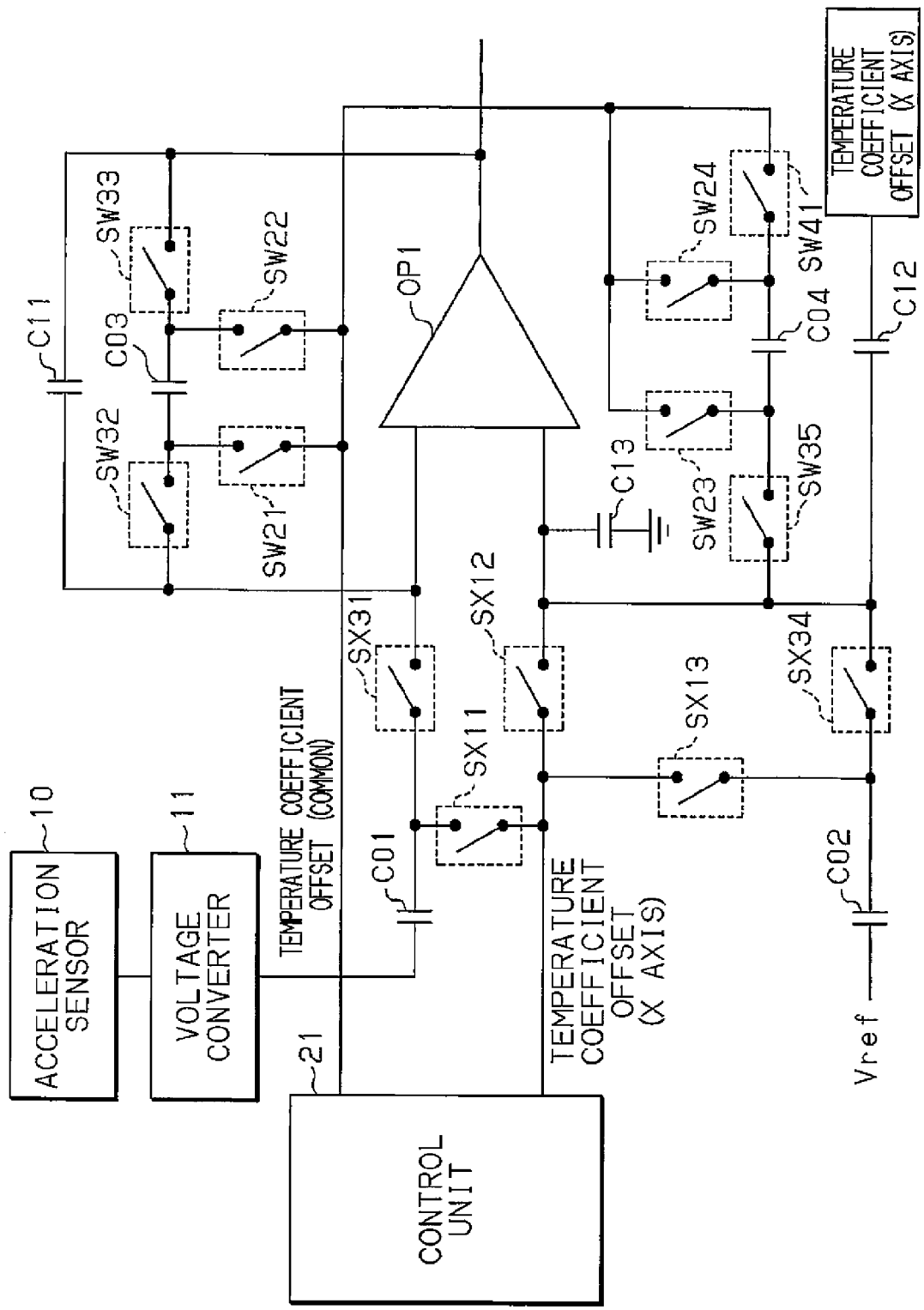
FIG. 6 is a circuit diagram showing the operation of the output circuit in a hold phase.

In the hold phase, the X axis clock switch group and the common clock switch group are open, as are the inverting X axis clock switch group and the inverting common clock switch group. This forms a connection relationship that is shown in FIG. 6.

The capacitor C13 maintains the accumulated charge, which maintains the X axis temperature coefficient offset voltage as a potential difference. The X axis temperature coefficient offset voltage also is applied to the two ends of the capacitor C12, which maintains the potential difference at zero in a discharged state.

In this case, the voltage resulting from the charge stored in the capacitors C11 and C13 is held. That is, the output resulting from the voltage of the capacitors C11 and C13 is maintained at the output terminal of the operational amplifier OP1, and the output circuit 20 functions as an output buffer. The voltage is the voltage resulting from the charge accumulated in the preceding amplification phase. The hold phase is continued during the period in which the Y or Z axis is in the amplification phase.

Figure 7:
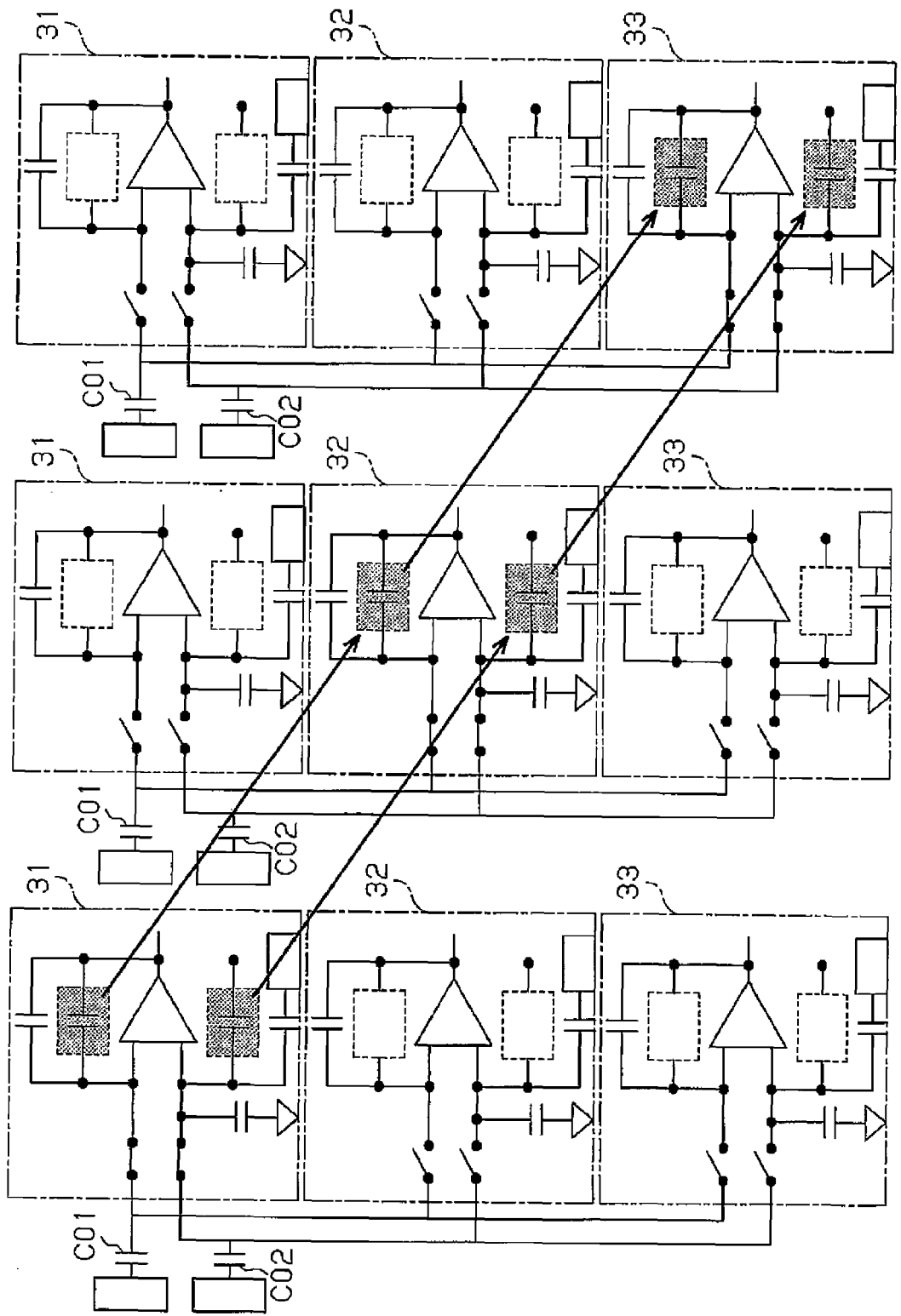
FIG. 7 is a diagram showing the usage of the common circuit.

The same operation as for the X axis is performed for the Y and Z axes at shifted timings. As shown in FIG. 7, the first and second common circuits CC1 and CC2 are used sequentially by the amplification unit for each axis. In other words, the first and second common circuits CC1 and CC2 are used first for the X axis amplification, the Y axis amplification, and then the Z axis amplification. Afterwards, the first and second common circuits CC1 and CC2 are used again for the X axis amplification.

The output circuit described above has the following advantages.

The first and second common circuits CC1 and CC2 do no simultaneously perform amplification for each axis and are shared in the amplification phase of each axis. Thus, each amplification unit does not need the capacitors C03 and C04 for such a purpose. This allows for the area of the output circuit 20 to be reduced.

The capacitors C03 and C04 are discharged in the reset phase. This resets the charge influence of other axes.

The two ends of each of the capacitors C03 and C04 are short circuited via the feed line for the offset common signal by the switches SW21 to SW24. When short circuited to ground, in a MOS transistor that is used as a switch, the charge of a capacitor between the gate and drain (source) is varied by a large amount when shifting to the amplification phase. This lengthens the time required for the voltage to stabilize. Further, the charge of the parasitic capacitor of the switch is large. This may increase noise.

In contrast, when using the feed line for the offset common signal during the reset phase, the capacitors C03 and C04 are discharged at the temperature coefficient offset voltage that is closed to the middle of the power supply voltage. This reduces the amount of charge collected in the capacitor between the gate and drain (source) of the MOS transistor in the switches SW21 to SW24.

Then, during the amplification phase, in the operational amplifier, the non-converting terminal has the X axis temperature coefficient offset voltage that is accumulated in the capacitor C13, and the inverting input terminal has the X axis temperature coefficient offset voltage (virtual short). Thus, the amount of charge in the capacitor between the gate and drain (source) of the switches SW21 to SW24 is small. A reduction in the time required for the voltage to stabilize may thereby be expected. Further, the amount of charge in the capacitor of the switch is also small. Thus, suppression of noise during charging and discharging may be expected. Accordingly, the use of the feed line for the offset common signal quickly stabilizes the voltage when shifting from the reset phase to the amplification phase and reduces noise.

The capacitors C11 and C03 are connected in parallel during the amplification phase. In the reset phase, the capacitor C03 is discharged, and the capacitor C11 continues to hold the charge of the preceding cycle. Then, in the amplification phase, the capacitor C03 accumulates the charge of the capacitor C01, and the capacitor C11 accumulates the charge corresponding to the difference from the preceding cycle. The gain of the operational amplifier OP1 in this state may be expressed as [capacitor C01]/[capacitor C03]. Further, the relationship of the capacitor C11, the capacitor C03, and the sampling frequency functions as a lowpass filter for a cutoff frequency. The cutoff frequency fc is expressed as shown below.

$$fc = 1/2\pi/([C11]/[C03]*1/\text{sampling frequency})$$

The capacitors C11, C21, and C31 are arranged in each of the X, Y, and Z axis amplification units 31, 32, and 33. This allows for the output voltage for each axis to be independently held.

It should be apparent to those skilled in the art that the present invention may be embodied in many other specific forms without departing from the spirit or scope of the invention. Particularly, it should be understood that the present invention may be embodied in the following forms.

The output circuit is used for the output of a three-axis (X, Y, and Z axes) acceleration sensor. However, the present invention is not limited to three axes. The present invention may be applied to an output circuit for two axes, in which the capacitors are used in common to reduce the circuit area.

In the above-described embodiment, the present invention is applied to an output circuit for an acceleration sensor. However, the application subject is not limited in such a manner.

In the above-described embodiment, the capacitor C03 is arranged in the first common circuit CC1, and the capacitor C04 is arranged in the second common circuit CC2. Instead, the capacitor C03 may be arranged in the amplification unit of each axis. In such a case, only the capacitor C04 is commonly used.

The present examples and embodiments are to be considered as illustrative and not restrictive, and the invention is not to be limited to the details given herein, but may be modified within the scope and equivalence of the appended claims.

What is claimed is:

1. An output circuit, comprising:
    a first capacitor sequentially provided with sensor measurement signals from a plurality of sensors;
    a differential amplification circuit arranged for each sensor and including a first terminal, which receives a voltage of the first capacitor, and a second terminal, which receives a reference voltage for correcting the sensor measurement signals;
    a hold capacitor arranged in each differential amplification circuit between an output terminal and the first terminal;
    a correction coefficient generation circuit that sequentially provides correction coefficients for correcting the sensor measurement signals of the sensors;
    a second capacitor that accumulates the correction coefficients from the correction coefficient generation circuit and provides the correction coefficients to the second terminal of the differential amplification circuit; and
    a first switch circuit that connects the second capacitor to each differential amplification circuit in synchronism with the sensor measurement signals.

2. The output circuit of claim 1, wherein the first switch circuit executes a reset phase to short circuit two ends of the second capacitor before connecting the second capacitor to each differential amplification circuit.

3. The output circuit of claim 2, further comprising:
    a second switch circuit arranged in each differential amplification circuit to connect a third capacitor between the output terminal and the first terminal;
    wherein the second switch circuit connects the third capacitor to each differential amplification circuit in synchronism with the sensor measurement signals.

4. The output circuit of claim 3, wherein the second switch circuit short circuits two ends of the third capacitor in the reset phase.

5. The output circuit of claim 1, wherein the first capacitor is connected to an acceleration sensor that measures acceleration for a plurality of axes, and obtains from the acceleration sensor a signal that arranges acceleration detection signals for each axis in chronological order as the sensor measurement signals.

* * * * *